United States Patent [19]

Koch

[11] Patent Number: 4,786,962
[45] Date of Patent: Nov. 22, 1988

[54] PROCESS FOR FABRICATING MULTILEVEL METAL INTEGRATED CIRCUITS AND STRUCTURES PRODUCED THEREBY

[75] Inventor: Tim R. Koch, Corvallis, Oreg.

[73] Assignee: Hewlett-Packard Company, Palo Alto, Calif.

[21] Appl. No.: 871,660

[22] Filed: Jun. 6, 1986

[51] Int. Cl.⁴ .............................................. H01H 23/48
[52] U.S. Cl. ........................................ 357/71; 357/65; 357/67; 437/51; 437/56
[58] Field of Search .......................................... 357/71

[56] References Cited

U.S. PATENT DOCUMENTS 4,592,132  6/1986  Lee et al. ............................ 357/71
4,651,191  3/1987  Ooue et al. .......................... 357/71

Primary Examiner—Robert S. Macon
Attorney, Agent, or Firm—William J. Bethurum

[57] ABSTRACT

The specification describes a multilevel metal CMOS integrated circuit wherein a first or lower level of metallization comprises strips of tungsten over aluminum. These strips are connected through vias in an intermetal dielectric layer to an upper or second level of metallization which is photodefined in a desired pattern. The tungsten suppresses hillocks in the underlying aluminum during high temperature processing and also advantageously serves as an etch stop material during integrated circuit fabrication.

3 Claims, 2 Drawing Sheets

PROCESS FOR FABRICATING MULTILEVEL METAL INTEGRATED CIRCUITS AND STRUCTURES PRODUCED THEREBY

TECHNICAL FIELD

This invention relates generally to multilevel metal integrated circuit fabrication processes and more particularly to a new and improved high density multilevel metal integrated circuit having adjacent metal and insulating layers of improved quality and reliability.

BACKGROUND ART

In the manufacture of complementary metal-oxide-silicon (CMOS) integrated circuits, it is known to provide multiple levels of aluminum on top of a silicon substrate and insulate these levels from one another with a dielectric layer such as silicon dioxide, $SiO_2$. In order to interconnect these aluminum layers at selected circuit locations, holes or "vias" are etched in the silicon dioxide layer, and the upper layer of aluminum is deposited in part in these vias to make electrical connections with the lower aluminum layer. In this manner, separate circuitry may be provided for both P-channel and N-channel transistors or other devices which have been fabricated in the silicon substrate, as well known in the art.

One problem which arises in the above type of CMOS integrated circuit fabrication process is the formation of hillocks or spikes in the lower aluminum layer. In some cases, these hillocks or spikes are sufficiently large and sharp so as to completely penetrate the overlying silicon dioxide layer and provide an electrical short to the next level overlying aluminum layer.

DISCLOSURE OF INVENTION

The general purpose of this invention is to provide a new and improved multilevel metal CMOS fabrication process which features a novel solution to the above problem of hillocks in the aluminum and accompanying electrical shorts and without sacrificing circuit density or producing pitting or other undesirable side effects. To accomplish this purpose, I have discovered and developed a novel multilevel metal integrated circuit fabrication process which includes initially providing a substrate of semiconductor material and having a surface insulating layer thereon. Next, a first level of metallization comprising one or more strips of aluminum covered by a surface layer of tungsten are photolithographically defined on the surface insulating layer. Then, an inter-metal insulating layer is deposited to surround the first level of metallization, and thereafter a second level of metallization is provided atop the inter-metal insulating layer. This second level of metallization makes contact to the first level of metallization through openings or vias in the inter-metal insulating layer. In this process, the tungsten layer which is part of the first level of metallization provides an etch stop function in the process of making openings or vias in the inter-metal insulating layer and it further prevents hillocks from occuring in the first level of aluminium metallization underneath it which would otherwise short through the inter-metal insulating layer to reach the second level of metallization.

The above process is carried out at a high circuit density on the order of one micrometer line width spacings and produces no pitting in the metallization layers thus formed.

The above advantages and novel features of this invention will become more readily apparent in the following description of the accompanying drawings.

BEST MODE FOR CARRYING OUT THE INVENTION

Figure 1:
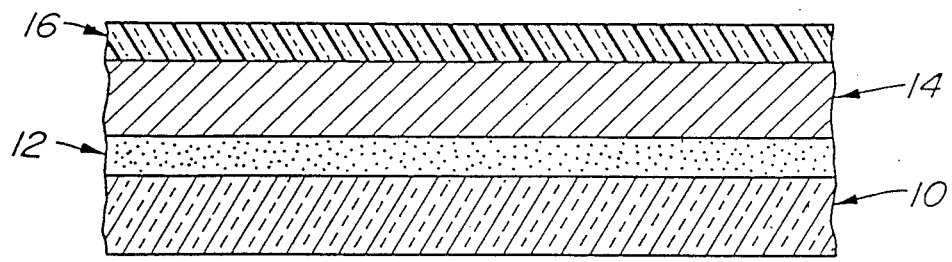
FIGS. 1 through 5 respectively show, in schematic cross section form, the process sequence used in fabricating a multilevel metal integrated circuit in accordance with a preferred embodiment of my invention.

Referring now to FIG. 1, the composite layered structure shown therein includes a silicon substrate 10 upon which a thin layer 12 of silicon dioxide has been sputter deposited using known deposition techniques. The thickness and other processing details of this layer and other circuit layers herein are set forth in the table at the end of the specification. The silicon substrate will have, for example, CMOS integrated circuits (I.C.S.) previously fabricated therein, and electrical connections are made to active or passive I.C. devices in the substrate 10 through openings (not shown) in the oxide layer 12 and to the first level of metallization to be described. However, since the present invention is directed particularly to the multilevel metal fabrication and interconnection process, the IC fabrication process details have been omitted herein and are generally well known to those skilled in the art.

Figure 2:
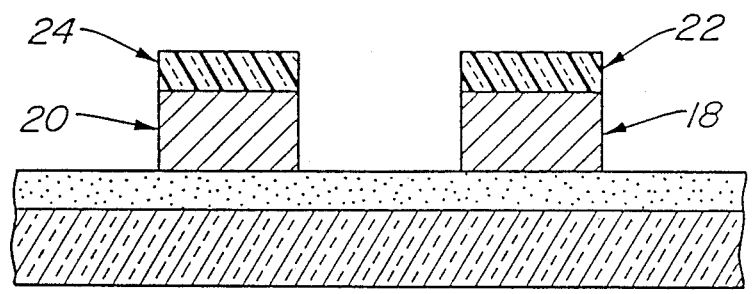

A first level 14 of aluminum metalization is vacuum deposited on the surface of the silicon dioxide layer 12, and then a thin layer 16 of tungsten is deposited over the first metal layer 14 to complete the composite layered structure of FIG. 1. Next, as shown in FIG. 2, a first plurality of metal strips 18 and 20 of aluminum covered by strips 22 and 24 of tungsten are patterned using known photolithographic masking and etching processes. Specifically, the tungsten film 16 was patterned with photoresist and etched in a plasma etcher with sulphur hexafloride gas, $SF_6$. The underlying layer 14 of aluminum was etched using the tungsten and photoresist as a etch mask as will be understood by those skilled in the art and is described in more process detail in the example given below.

Figure 3:
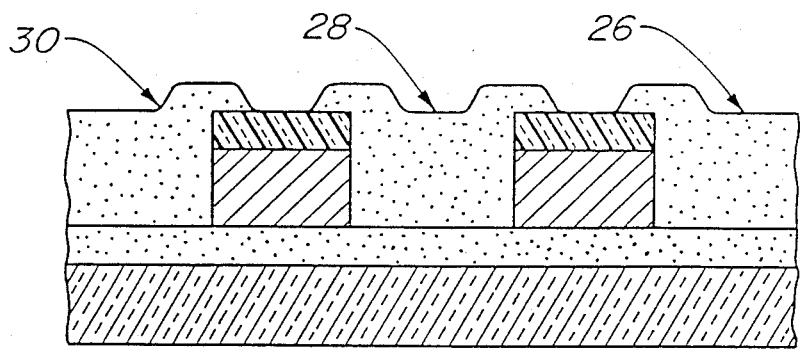

Next, as shown in FIG. 3, an inter-metal dielectric film 26 of silicon oxy-nitride $SiO_xN_y$ was deposited over the entire surface of the structure shown in FIG. 2 and then planarized, both using the process described in U.S. Pat. No. 4,545,852 of Donald L. Barton, assigned to the present assignee and incorporated herein by reference. Then, using conventional masking and etching processes, a pair of openings 28 and 30 were etched through the surface of the film 26 to expose portions of surface areas of the tungsten strips 22 and 24. The thin tungsten strips 22 and 24 are on the order of 0.02 to 0.10 micrometers in thickness and will suppress the formation of hillocks in the underlying aluminum films 18 and 20 during the high temperature deposition of the dielectric layer 26. Additionally, the tungsten material will act as an etch stop when used in a plasma etcher with CF4 and argon gasses, since tungsten etches very slowly when exposed to these etchants and thereby prevents the etching of the underlying aluminum film 18, 20. If the aluminum strips 18 and 20 were not protected by the tungsten strips 22 and 24, chemical reactions would occur between the aluminum strips in FIG. 3 and the gasses in the plasma etcher and cause the formation of aluminum floride and aluminum-carbon compounds.

Figure 4:
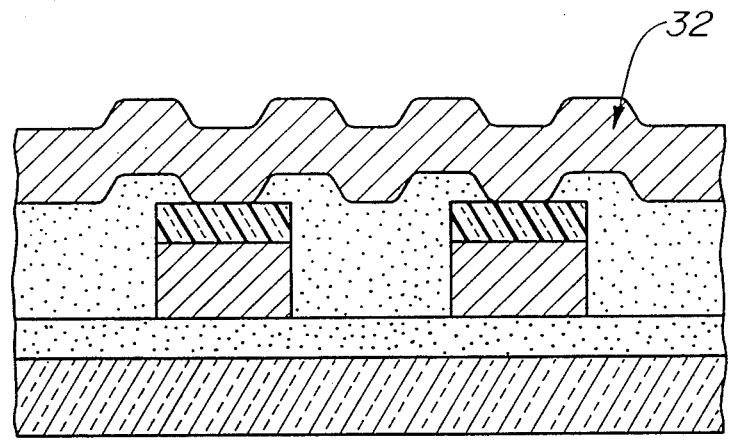
Figure 5:
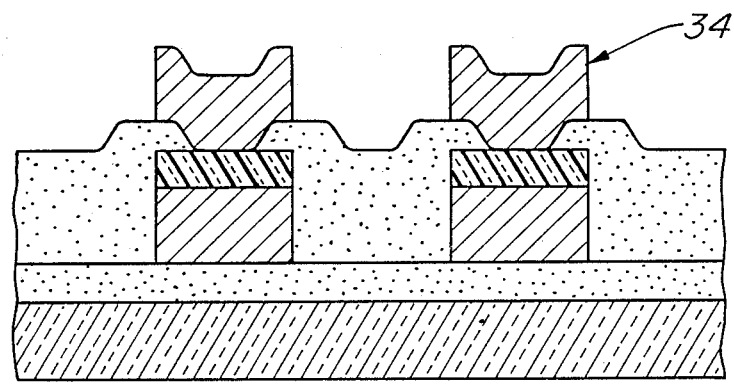

Next, as shown in FIG. 4, a second layer 32 of metallization is deposited over the entire upper surface of the structure of FIG. 3 and thereafter second level metallization strips 34 are photolithographically defined by known masking and etching processes to form the device geometry shown in FIG. 5. This step provides the interlevel metal electrical contact to the strips of metallization in the first level of metallization previously described. The second layer 32 of metallization is patterned with photoresist, and the tungsten layer in the first level of metal acts as an etch stop during the etching of the second layer of aluminum and prevents the etching of the first layer of aluminum.

Therefore, it is seen that the tungsten film serves as a hillock suppression layer for the aluminum film beneath the tungsten and thereby allows higher temperature operations than would otherwise be possible without causing hillock formation in the aluminum film. Hillocks are known to cause metal shorting between the first and second levels of metal due to the planarization processing of the intermetal dielectric material. Additionally, the tungsten film serves as an etch stop material for the contact etching process, and the tungsten etch rate is relatively low compared to the dielectric etch rate. Additionally, the aluminum is protected during the contact etch process and prevents problems associated with compound formation of the aluminum and the etch gasses during the etching process. Without the tungsten layer, the aluminum compound formation creates a deposit on the sides of the contact holes which cannot be removed and thereby leaves a cone of material of such deposit. This cone of aluminum compound prevents the second layer of aluminum from completely depositing into and around the contact hole or via thus formed.

The tungsten on aluminum also improves the electromigration lifetime of the conductor, and this feature in turn improves the reliability of the integrated circuit produced by this process. The tungsten film also acts as an antireflection layer on the aluminum film and thereby improves the patterning process for masking the conductor layer. The lower reflectivity of the tungsten film in comparison to the aluminum layer reduces the notching of the photoresist lines during the exposure operation. Since the tungsten film at the bottom of the contacts holes is an etch stop material during the etching of the second layer of aluminum, this feature allows the contacts to be partially enclosed by the second layer of aluminum instead of fully enclosed, thereby enabling a higher integrated circuit density.

The pure tungsten film on aluminum with 1% silicon in the aluminum does not have the problem of contact spiking during the high temperature processing of the integrated circuits, which is usually 400° centigrade or greater. In the prior art, others have tried the use of pure layers of titanium or titanium tungsten mixtures on aluminum. These processes have been characterized by contact spiking into the underlying silicon substrate, and this in turn destroys the electrical integrity of the integrated circuit.

TABLE

| LAYER | PROCESS FLOW |
| --- | --- |
| 12 & 10 | Deposit SiO2 by chemical vapor deposition at 450° C. on silicon wafer over previously defined semiconductor devices. |
| | Photolithographically define contact holes on SiO2 layer with photoresist. Etch contact holes in SiO2 layer to connect semiconductor devices to first level of metallization. |
| 14 | Vacuum sputter deposit 0.75 microns of Al—Si (1%) on SiO2. |
| 16 | Vacuum sputter deposit 0.050 microns of tungsten on Al—Si (1%). Photolithographically define first level of metallization with photoresist. |
| 22 & 24 | Plasma etch the W layer for 30 seconds using SF6 gas at 0.30 torr of pressure with 150 watts of power. |
| 20 & 18 | Plasma etch the Al—Si (1%) layer using Cl2, BCl3, CH3Cl, and He gasses at 3.3 torr of pressure with 270 watts of power. |
| 26 | Deposit intermetal dielectric of silicon oxide and silicon nitride using plasma-enhanced chemical vapor deposition at a temperature of 280 C. over the first level of metallization. Planarize the surface of the intermetal dielectric as described in U.S. Pat. No. 4,545,852 of D. L. Barton. Photolithographically define via holes on intermetal dielectric with photoresist. |
| 28 & 30 | Plasma etch via holes in the intermetal dielectric to connect second level of metallization to first level of metallization using CH4 and argon gasses at 1.5 torr of pressure at 300 watts of power. |
| 32 | Vacuum sputter deposit 1.0 micron of Al—Si (1%) on intermetal dielectric. Photolithographically define second level of metallization with photoresist. |
| 34 | Plasma etch the Al—Si (1%) layer with Cl2, BCl3, CH3Cl, and He gasses at 3.3 torr of pressure with 270 watts of power. |

INDUSTRIAL APPLICABILITY

The present invention may be used in the fabrication of random access memory chips, read only memory chips and the like useful in the manufacture of computers, calculators, and other integrated circuit applications.

I claim:

1. A process for fabricating multilevel metal integrated circuits including the steps of:
    a. providing a semiconductor substrate with a surface insulator thereon,
    b. providing a first level of metallization comprising one or more strips of aluminum covered by corresponding surface strips of tungsten,
    c. providing an inter-metal insulating layer surrounding said first level of metallization and having openings therein exposing preselected areas of said tungsten, and
    d. providing a second level of metallization atop said inter-metal insulating layer and comprising one or more strips of conductors positioned in vias or openings in said inter-metal insulating layer and making electrical contact with said tungsten, whereby said tungsten serves to prevent hillocks from occuring in the aluminum of said first level of metallization and further serves as an etch stop material during the etching of both said inter-metal insulating layer and the second level of metallization thereon.

2. A multilevel metal integrated circuit including:
    a. a semiconductor substrate having a surface insulator layer thereon, b, one or more strips of aluminum formed on said surface insulator and covered with corresponding strips of tungsten, c. an inter-metal insulating layer surrounding said strips of aluminum and tungsten and having openings therein exposing predetermined surface areas of said tungsten, and d. a second level of metallization disposed atop said inter-metal insulating layer and comprising one or more strips of surface conductor located in vias or openings in said inter-metal insulating layer and in electrical contact with said tungsten, whereby hillocks in said aluminum strips are suppressed by said tungsten without sacrificing integrated circuit density or causing pitting of metals within said multilevel metal integrated circuit.

3. A process for fabricating multi-level metal integrated circuits including the steps of:

a. providing a selected substrate with a surface insulator thereon or as an integral part thereof, b. providing a first level of metallization on said substrate and comprising one or more strips of aluminum covered by corresponding strips of a chosen refractory metal sufficient in strength to suppress the formation of hillocks or spikes in said strips of aluminum when heated to or beyond a predetermined elevated temperature, c. providing an intermetal insulating layer surrounding said first level of metallization and having openings therein exposing preselected areas of said refractory metal, and d. providing a second level of metallization atop said intermetal insulating layer and comprising one or more strips of conductors positioned in said openings in said intermetal insulating layer and making electrical contact with said selected refractory metal.

* * * * *